United States Patent
DCamp et al.

(10) Patent No.: US 7,314,777 B2
(45) Date of Patent: Jan. 1, 2008

(54) CHIP PACKAGING SYSTEMS AND METHODS

(75) Inventors: Jon B. DCamp, Savage, MN (US); Harlan L. Curtis, Champlin, MN (US); Lori A. Dunaway, New Hope, MN (US); Max C. Glenn, Chanhassen, MN (US)

(73) Assignee: Honeywell International Inc., Morristown, NJ (US)

( * ) Notice: Subject to any disclaimer, the term of this patent is extended or adjusted under 35 U.S.C. 154(b) by 355 days.

(21) Appl. No.: 10/988,799

(22) Filed: Nov. 15, 2004

(65) Prior Publication Data

US 2006/0105499 A1   May 18, 2006

(51) Int. Cl.
- *H01L 21/50* (2006.01)
- *H01L 21/48* (2006.01)
- *H01L 21/44* (2006.01)
- *H01L 23/12* (2006.01)
- *H05K 3/30* (2006.01)

(52) U.S. Cl. ............ 438/106; 438/125; 438/107; 257/704; 29/740; 29/741

(58) Field of Classification Search ........ 438/106–107, 438/125; 257/704; 29/740–741, 759, 840; 414/222–223, 226.01, 730, 736; 221/3, 6, 221/74
See application file for complete search history.

(56) References Cited

U.S. PATENT DOCUMENTS

| | | | |
|---|---|---|---|
| 3,724,068 A * | 4/1973 | Galli | 29/833 |
| 4,653,664 A * | 3/1987 | Hineno et al. | 221/3 |
| 4,819,699 A * | 4/1989 | Brown et al. | 140/105 |
| 5,351,876 A | 10/1994 | Belcher et al. | |
| 5,495,661 A * | 3/1996 | Gromer et al. | 29/740 |
| 5,562,384 A * | 10/1996 | Alvite et al. | 414/226.01 |
| 5,695,331 A | 12/1997 | Nutter et al. | |
| 5,809,639 A * | 9/1998 | Alvite | 29/740 |
| 6,069,027 A | 5/2000 | Mertol et al. | |
| 6,284,173 B1 | 9/2001 | Austin et al. | |
| 6,284,572 B1 | 9/2001 | Cantillep et al. | |
| 6,359,336 B1 | 3/2002 | Cantillep et al. | |

(Continued)

FOREIGN PATENT DOCUMENTS

EP   0425796   8/1991

OTHER PUBLICATIONS http://www.brooks.com/tmp/888.PDF, "Measuring Reliability, Availability, and Maintainability (RAM) on Complex Semiconductor Cluster Tools," 9 pages, prior to filing date of present application.

(Continued)

*Primary Examiner*—Luan Thai
(74) *Attorney, Agent, or Firm*—McDonnell Boehnen Hulbert & Berghoff LLP (57) ABSTRACT

An automated process for performing MEMS packaging including automatically attaching a die to a chip carrier, resulting in a chip carrier assembly, automatically moving the chip carrier assembly into a vacuum chamber, wherein the vacuum chamber includes one or more lids therein, automatically securing a lid to the chip carrier assembly within the vacuum chamber, thereby forming a packaged die, and automatically removing the packaged die from the vacuum chamber. Unique vacuum chambers suitable for MEMS packaging are also disclosed.

22 Claims, 4 Drawing Sheets

U.S. PATENT DOCUMENTS

| | | | |
|---|---|---|---|
| 6,367,635 | B1 | 4/2002 | Auer |
| 6,640,423 | B1 * | 11/2003 | Johnson et al. ............... 29/740 |
| 6,656,017 | B2 | 12/2003 | Jackson |
| 6,826,829 | B2 * | 12/2004 | Pham et al. .................. 29/840 |
| 6,924,211 | B2 * | 8/2005 | Yamazaki et al. .......... 438/464 |
| 7,147,739 | B2 * | 12/2006 | Hiller et al. ................ 156/230 |
| 2001/0039062 | A1 | 11/2001 | Marinis et al. |
| 2002/0000646 | A1 | 1/2002 | Gooch et al. |
| 2003/0106791 | A1 | 6/2003 | Park |

OTHER PUBLICATIONS http://www.sierratherm.com/prod2006.htm, "SierraTherm VPG-2006 Series Vacuum Reflow Furnaces," 4 pages, printed Jan. 31, 2003.

http://www/sieratherm.com, "SierraTherm Conveyor Furnaces, IR Furnaces, LTCC Furnaces and APCVD Thin Film.Coating Systems," 3 pages, printed Feb. 7, 2005.

http://www.sierratherm.com/SolarCell.htm, "Solar Cell Processing Furnaces for coating and dpant drive-in . . . ," 5 pages, printed Feb. 7, 2005.

http://www.sierratherm.com/Pusher.htm, "SierraTherm 9500 High Temperature Closed Loop Pusher Furnace," 3 pages, printed Feb. 7, 2005.

http://www.sierratherm.com/prod5500.htm, "SierraTherm 550 Series APCVD Systems for Tin Oxide, Titanium Oxide and SIO2," 3 pages, printed Feb. 7, 2005.

http://www.sierratherm.com/prod1500.htm, "SierraTherm 1500 Series Conveyor Furnaces," 4 pages, printed Feb. 7, 2005.

http://www.sierratherm.com/prod2500.htm, "SierraTherm 2500 Series Conveyor Furnaces," 4 pages, printed Feb. 7, 2005.

http://www.sierratherm.com/prod3500.htm, "SierraTherm 3500 Series Reflow Conveyor Furnaces," 4 pages, printed Feb. 7, 2005.

http://www.sierratherm.com/prod4500.htm, "SierraTherm 4500 Series Conveyor Drying Ovens," 4 pages, printed Feb. 7, 2005.

http://www.sierratherm.com/prod7500.htm, "SierraTherm 7500 Series Infrared Conveyor Furnaces," 4 pages, printed Feb. 7, 2005.

http://www.sierratherm.com/prod8500.htm, "SierraTherm 8500 Series Batch Oven for LTCC," 4 pages, printed Feb. 7, 2005.

http://www.sierratherm.com/news.htm, "SierraTherm New Page," 1 page, printed Feb. 7, 2005.

http://www.sstinternational.com/product_body_overview.html, "SST International—Products," 1 page, printed Feb. 7, 2005.

http://www.sstinternational.com/product_body_1200.html, "SST International Products—Model 1200—Table Top Solder Reflow Station," 2 pages, printed Feb. 7, 2005.

http://www.sstinternational.com/product_body_3130.html, "SST International—Products—Model 3130—Programmable Vaccum/Pressure Furnace," 2 pages, printed Feb. 7, 2005.

http://www.sstinternational.com/product_body_3140.html, "SST International—Products—Model 3140/3150—High Vacuum Furnaces," 3 pages, printed Feb. 7, 2005.

http://www.sstinternational.com/product_body_2400.html, "SST International—Product—Model—PF-2400—Controlled Atmosphere Large Format Vacuum Furnace," 2 pages, printed Feb. 7, 2005.

http://www.sstinternational.com/product_body_waferbonders.html, "SST International," 3 pages, printed Feb. 7, 2005.

http://www.sstinternatioanl.com/product_body_gm.html, "SST International—Products—Graphite Machining," 2 pages, printed Feb. 7, 2005.

Sheppard, "Palomer Hopes to Dominate Assembly With Its one-Stop Shop," Small Times Media, 4 pages, 2002.

Palomar Technologies, "Model 2460-V Automatic Wire Bonder," 2 pages, 1998.

Palomar Technologies, "Model 3500-II Automatic Component Assembly Cell," 2 pages, 1998.

http://www.spectrum.ieee.org/WEBONLY/publicfeature/feb05/0205chip.html, "Chip Making's Singular Future," EEE Spectrum Online: Feature Article, 8 pages, printed Feb. 7, 2005.

* cited by examiner

CHIP PACKAGING SYSTEMS AND METHODS

GOVERNMENT SUPPORT

This invention was made with government support under Air Force Contract Number F33615-01-2-5705. The government may have certain rights in the invention.

FIELD

The present invention is related to the field of micro-electro-mechanical systems (MEMS) packaging, and more particularly, to methods and systems for micro-electro-mechanical systems (MEMS) vacuum packaging.

BACKGROUND

An important aspect of many MEMS (or many other electronic chip) devices is the development and execution of efficient, robust, and protective packaging strategies. Typically a wafer containing many MEMS devices is cut into a number of MEMS die, which are then individually packaged using relatively complex and labor intensive processes. For many MEMS devices, particularly those using moving features such as cantilever beams or other suspended structures, there is a desire to create a well-contained and controlled environment such as a vacuum environment. Such packaging often includes a cavity formed by a chip carrier and a lid. A getter is sometimes provided in the cavity to capture gasses that enter the cavity through out gassing and/or small leakage paths.

Typically, each MEMS device is secured to a chip carrier via solder, adhesive, or in some other way. This mechanically secures the MEMS device to the chip carrier, and is often performed using a conventional die bonding machine. One such die bonding machine is the Automatic Component Assembly Cell 3500-II, available from Palomar Technologies, Inc., located in Vista, Calif. Once the MEMS device is secured to the chip carrier, the I/O pads on the MEMS device are electrically wired to pads on the chip carrier. This is often performed using a conventional wire bonding machine. One such wire bonding machine is the Model 2460-V Automatic Wire Bonder, also available from Palomar Technologies. When flip-chip bonding is used, ball bonds or the like may be used to both secure the MEMS device to the package and to electrically connect the I/O pads of the MEMS device to pads on the chip carrier, as is known in the art.

Next, a solder ring or the like is often placed on the chip carrier. The solder ring will eventually be used to solder the lid to the chip carrier to create a vacuum seal for the enclosed MEMS device. In many cases, the chip carrier assembly is baked in a vacuum environment for some time to cause the materials used in the chip carrier assembly to outgas as much as possible.

A getter may be spot welded or otherwise attached to the package lid. The chip carrier assembly and the lid are then typically placed in a vacuum chamber, and heat is applied to activate the getter. Once the getter is activated, the lid is brought into alignment with the chip carrier assembly, and heat and pressure are applied so that the solder ring secures and seals the lid to the chip carrier assembly, thereby providing a vacuum environment for the enclosed MEMS device.

In many cases, the above process steps are performed in a manual or semi-automated way. Some of the steps may be performed using some batch process techniques and/or some automated equipment. However, significant manual handling of the parts is still often required. What would be desirable, therefore, is a more automated process for packaging MEMS devices.

SUMMARY

The present invention relates to MEMS packaging, and more particularly, to a more automated method for packaging MEMS device. In one illustrative embodiment, the present invention automatically attaches a die to a chip carrier, resulting in a chip carrier assembly. The chip carrier assembly is then automatically moved into a vacuum chamber, wherein the vacuum chamber includes one or more lids therein. The lids are automatically secured to the chip carrier assembly within the vacuum chamber, thereby forming a packaged die. The packaged die is then automatically removed from the vacuum chamber. Unique vacuum chambers suitable for MEMS packaging are also contemplated.

The above summary is not intended to describe each disclosed embodiment or every implementation of the present invention. The Figures, Detailed Description and Examples which follow more particularly exemplify these embodiments.

DETAILED DESCRIPTION

The following detailed description should be read with reference to the drawings. The drawings, which are not necessarily to scale, depict illustrative embodiments and are not intended to limit the scope of the invention.

Figure 1:
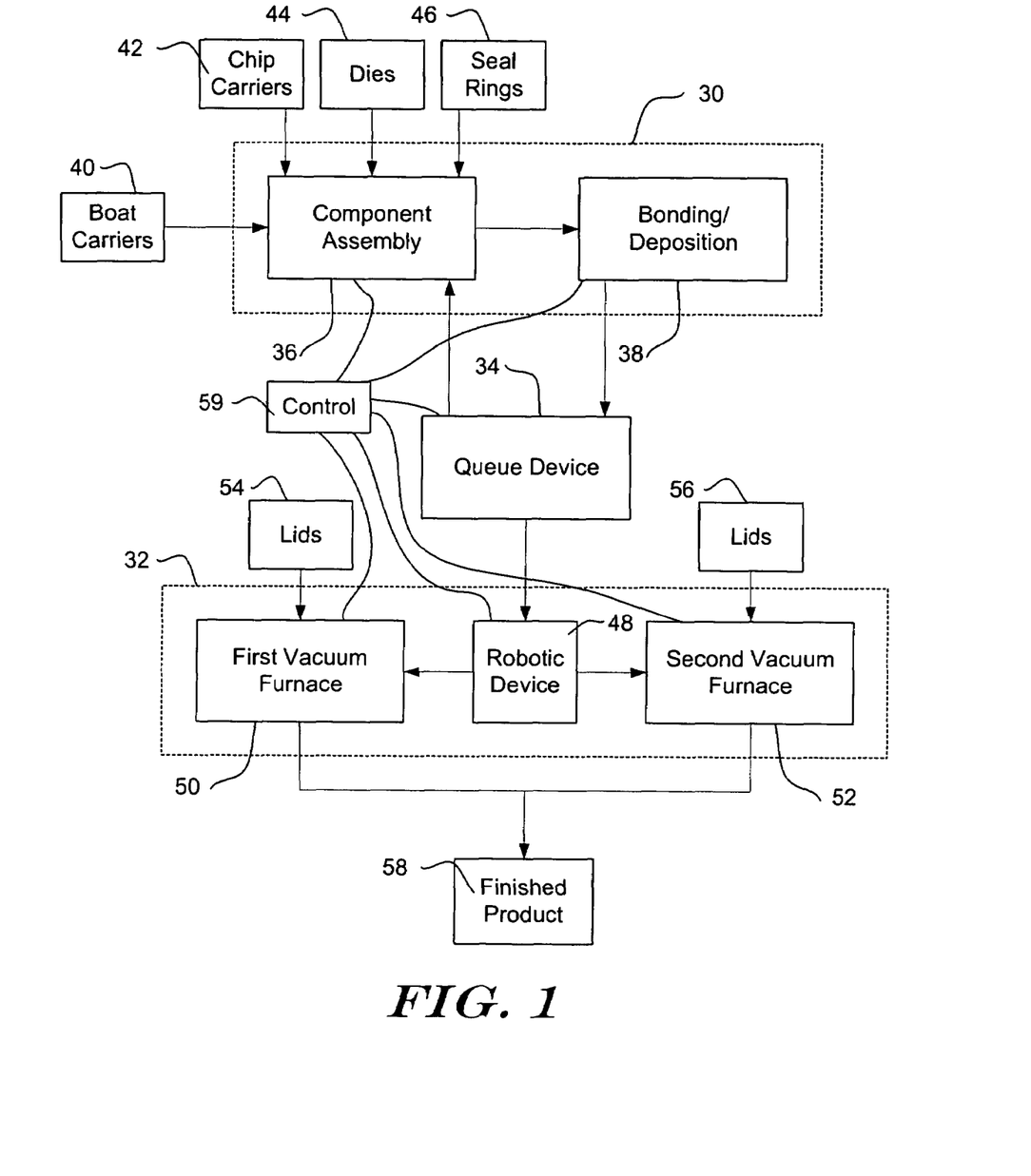
FIG. 1 is a block diagram of a system in accordance with an illustrative embodiment of the present invention.

FIG. 1 is a block diagram of an in-line packaging system in accordance with an illustrative embodiment of the present invention. The in-line packing system includes a first subsystem 30 and a second subsystem 32, with a queue device 34 controlling component movement therebetween. The queue device 34 may be, for example, a magazine handler having modes such as first-in-first-out, last-in-first-out, pass-through, etc.

In the illustrative embodiment, the first subsystem 30 includes a component assembly device 36 and a bonding/deposition device 38. The component assembly device 36 may be, for example, a Model 3500-II Automatic Component Assembly Cell, and the bonding/deposition device 38 may be a Model 2460 Automatic Wire Bonder, both available from Palomar Technologies, Vista, Calif. These are illustrative devices, and it should be recognized that any suitable component assembly and bonding/deposition devices may be used, as desired.

In an illustrative operation, a number of empty boat carriers 40 are sent into the component assembly device 36 (for example, from another magazine handler, which is not shown). The boat carriers may be, for example, Auer boat carriers, and may come in a variety of sizes and configurations. An illustrative boat carrier is shown in U.S. Pat. No. 6,367,635 to Auer, the disclosure of which is incorporated herein by reference.

The component assembly device 36 is provided with a number of chip carriers 42 that, in some cases, may be Leadless Chip Carriers (LCCs). The component assembly device 36 places the chip carriers 42 into the various receiving recesses in each of the boat carriers 40. The boat carriers 40, with the chip carriers 42 placed thereon, are then passed to the bonding/deposition device 38, where in some embodiments, ball bumps are placed on the back surface of each of the chip carriers. In some cases, the bonding/deposition device 38 provides an adhesive on the back surface of each of the chip carriers rather than, or in addition to, the ball bumps.

From the bonding/deposition device 38, the boat carriers 40 pass a first time to the queue device 34, which may route the boat carriers 40 back to the component assembly device 36 in the first subsystem 30. Alternatively, two (or more) first subsystems 30a and 30b may be provided in series, with the boat carriers 40 passing from the bonding/deposition device 38a of the first subsystem 30a to the component assembly device 36b in the first subsystem 30b, if desired.

At the component assembly device 36 a second time, die 44 are placed on the ball bumps (and/or adhesive) of each of the chip carriers 42. In some cases, heat and sometimes pressure are applied to secure the die 44 to the back surface of each of the chip carriers to form a thermo-compression bond. However, it is contemplated that the die 44 may be secured to each of the chip carriers 42 using any suitable method, including using a solder, an adhesive, or in any other suitable technique, as desired. Next, the boat carriers 40 are passed to the bonding/deposition device 38, where wire bonds may be placed that connect the I/O pads on the die with corresponding I/O pads on the chip carriers 42.

In some embodiments, the die 44 may be flip-chip type devices having pads on their front side. With such die 44, attachment of the die to the ball bumps from the first pass may provide the desired electrical connections between pads on the die 44 and corresponding pads on the chip carriers 42. For such devices, wire bonding may not be needed during the second pass through the first subsystem.

From the bonding/deposition device 38, the boat carriers 40 are passed a second time to the queue device 34, which in the illustrative embodiment, again routes the boat carriers 40 back to the component assembly device 36 in the first subsystem 30. At the component assembly device 36 a third time, seal rings 46 are placed or tacked onto the chip carriers 42. The boat carriers 40 are then passed to the bonding/deposition device 38, which in the illustrative embodiment, merely passes the boat carriers 40 therethrough.

From the bonding/deposition device 38 the third time, the boat carriers 40 again go to the queue device 34, and are this time passed to the second subsystem 32. The second subsystem 32 is designed for bake-out and sealing of the packaged chips. Getter activation (if provided) may also be performed in the second subsystem. If desired, the second subsystem 32 may include a single vacuum furnace. Alternatively, and as shown in FIG. 1, the second subsystem 32 may include a first vacuum furnace 50 and a second vacuum furnace 52.

In some embodiments, a robotic device 48 may be provided for passing the devices to the first vacuum furnace 50 and/or the second vacuum furnace 52. The robotic device may be an automated furnace loader configured to place boat carriers 40 into one of the vacuum furnaces 50, 52, and may include a shuttle arm for loading boat carriers 40 into each furnace 50, 52. In an illustrative embodiment, the robotic device 48 receives boat carriers 40 from the queue device 34 and loads a first vacuum furnace 50 until the first vacuum furnace 50 is at capacity, and then begins loading the second vacuum furnace 52. In some embodiments, the vacuum furnaces may be single or dual chamber vacuum furnaces, as further described below. Once loaded, the first vacuum furnace 50 may go into a bake out sequence, followed by lid placement and sealing, with optional getter activation.

When the first and second vacuum furnaces 50 and 52 are dual chamber furnaces, the first vacuum furnace 50 may bake the loaded boat carriers 40 for a first time period at a predetermined bake out temperature using a first vacuum level in a first furnace chamber. While the first chamber is performing the bake out sequence, a second chamber may be depressurized to a vacuum level that approximates the first vacuum level. The second chamber may include a lid placement system for mechanically placing lids 54, 56 onto the individual chip carriers 42 on the boat carriers 40.

When the lids 54, 56 include a getter requiring activation, a getter activation sequence may take place in the second chamber, in parallel with the bake out sequence in the first chamber, in which the second chamber is taken to a second vacuum level at a second temperature to activate the getters. The second temperature may be higher than the first temperature. For example, getter activation may occur in the range of 350-500 degrees C., while the bake out sequence may be at or below the eutectic temperature of the solder ring, which may be in the range of 200-350 degrees C. These are only illustrative temperatures, and may vary depending on the materials used.

Once the bake out and getter activation are complete, the vacuum levels between the chambers may be equalized, and a divider between the chambers may be opened. The boats may then be passed to the second chamber for lid attach. The boats may be passed to the second chamber using a robot, a moving belt or in any other suitable way. The temperature in the second chamber may be brought to a third temperature (i.e. at or above the eutectic temperature of the solder ring), and the vacuum level may be brought to at a third vacuum level. In some cases, one or more inert gasses may be added to the second chamber to create the desired environment for the packaged die. The lids may then be brought into engagement with the solder rings, in some cases with the assistance of a lid handler. The lids may be temporarily secured to the lid handler, which may be suspended above the boats. The lid handler may include a separately controlled heater that heats the lids separate from the boats. For example, the lid handler may include a resistive heating element that heats the lid handler and thus the lids. This may allow the lids, and any accompanying getter, to be heated to the getter activation temperature (e.g. 450 degrees C.). In some cases, heat and/or pressure may be applied between each lid and chip carrier to cause the solder ring to reflow, thereby helping to create a hermetic seal between the chip carrier and the lid.

In some cases, solder rings may not be used. For example, the lids may be secured to the chip carrier using other methods such as resistance welding. When resistance welding is used, for example, it may not be necessary to artificially increase the temperature in the vacuum chamber to at or near a solder reflow temperature.

In any case, the temperature may then be allowed to fall toward ambient, and the vacuum may be removed. The vacuum levels and temperatures are described herein as changing from one step to another, but it should be recognized that these levels need not vary widely, if at all, and are dependent upon the materials and devices used.

When the first and second vacuum furnaces only have a single vacuum chamber, the above describes steps may all take place in the single vacuum chamber, and the boats need not be shuttled between first and second vacuum chambers. In such an embodiment, the single vacuum chamber may also include a lid handler. The lids may be temporarily secured to the lid handler, which may be suspended above the boats. The lid handler may include a separately controlled heater that heats the lids separate from the boats. For example, the lid handler may include a resistive heating element that heats the lid handler and thus the lids. This may allow the lids, and any accompanying getter, to be heated to the getter activation temperature (e.g. 450 degrees C.) separately from the boats, which may remain below the eutectic solder temperature (e.g. 300 degrees C.) during the bake out process. Thus, getter activation may occur in the same chamber and sometimes at or near the same time as the bake out process, if desired. Once the bake out process is complete, and the getter is activated, heat and/or pressure may be applied between each lid and chip carrier to cause the solder ring to reflow, thereby helping to create a hermetic seal between the chip carrier and the lid. The lid handler may be adapted to move the lids until they engage the chip carriers, if desired. When resistance welding is used, the chamber may not need to be heated to the solder reflow temperature. Instead, pressure and a rather large voltage may be applied between the lid and the chip carrier, often assisted by the lid handler, to form the desired resistance weld.

In the illustrative embodiment, the second vacuum furnace 52 may operate similar to, and in parallel with, the first vacuum furnace 50. Thus, in the illustrative embodiment, the second vacuum furnace 52 may increase the throughput of the packaging process. Also, it is contemplated that more than two vacuum furnaces may be provided to further increase the throughput of the packaging process, if desired.

In some cases, the vacuum furnace(s) or chambers may be adapted to accept only a single or few (e.g. two, four, etc.) chip carriers. This may help reduce the vacuum pump down time required to achieve a desired vacuum level in the vacuum furnace(s) or chambers.

After the getter activation and cap seal sequence is performed in the vacuum furnaces 50, 52, the vacuum furnaces 50, 52 are unloaded. Unloading can occur by the use of the robotic device 48, or the furnaces 50, 52 may be configured to unload themselves. The result is a finished product 58 that includes a sealed chip including the chip carrier 42, a packaged die 44, and a lid 54, 56, optionally including an activated getter therein. If desired, the boat carriers 40 may then be loaded onto another magazine handler until the chip carriers 42 can be unloaded.

Figure 2:
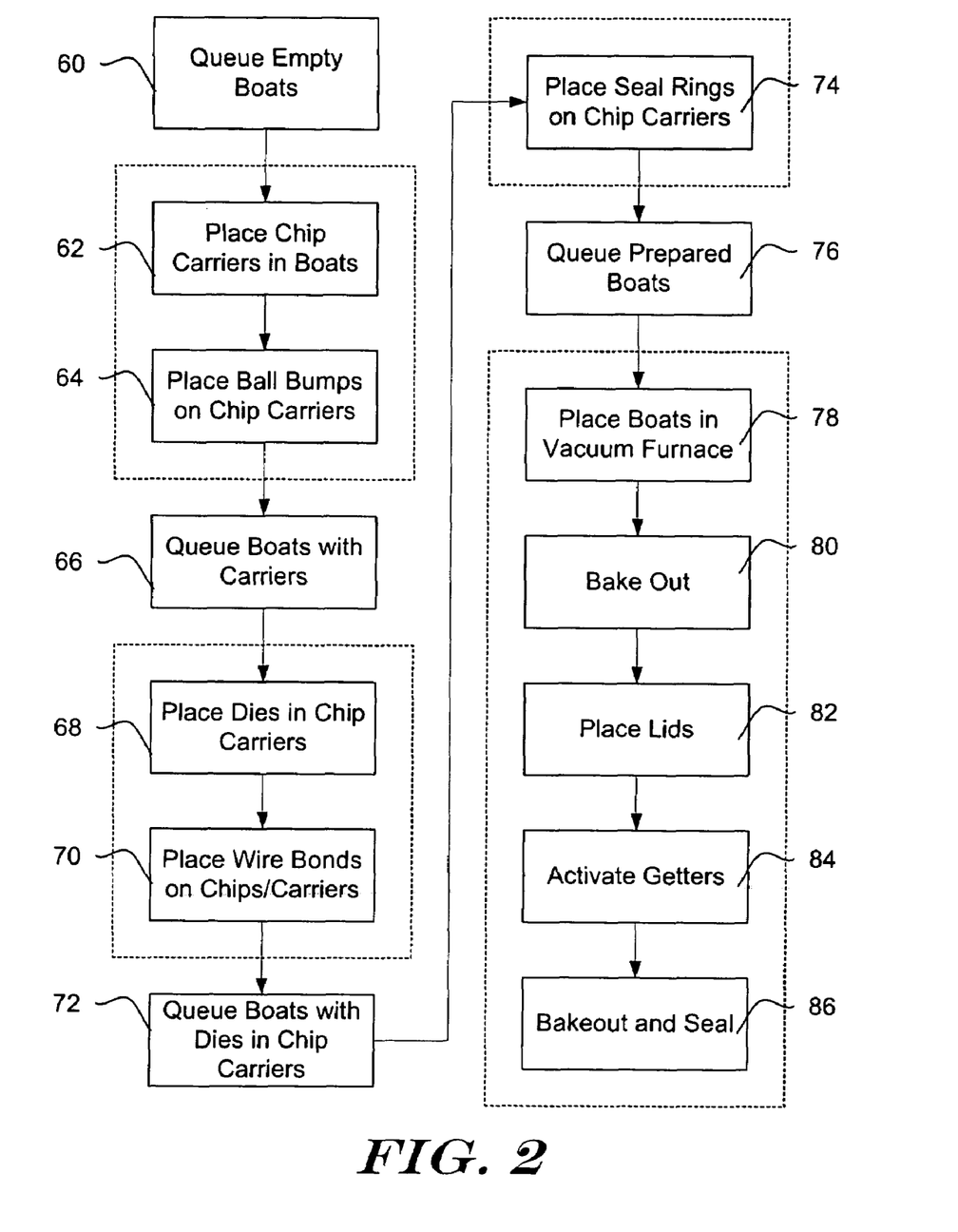
FIG. 2 is a block diagram of an illustrative method in accordance with the present invention.

Also illustrated in FIG. 2 is a controller 59, which may optionally be included to control the functioning of the various system elements as described with reference to FIG. 2. For example, the controller 59 may be provided with a readable memory having an instruction set executable for performing the methods described with reference to FIG. 2 and/or the method described with respect to FIG. 3. The controller 59 may take any suitable form, including a microcontroller, computer, PDA, or the like. While the controller 59 is shown as having connections to several system elements, a wireless communication system/protocol may also be used for delivering commands from the controller to the system elements.

FIG. 2 is a block diagram of an illustrative method in accordance with the present invention. The illustrative method begins by queuing empty boats, as noted at 60. Next, chip carriers are placed in the boats as shown at 62, and ball bumps are placed on the chip carriers as shown at 64. In some embodiments, these two steps 62, 64, as indicated by the box, may be performed during a first pass through the first subsystem 30 of FIG. 1.

The method is continued by queuing the boats with the carriers, as shown at 66. Next, die are placed and secured to the chip carriers 68, and in some cases, wire bonds are provided between the chips and carriers, as shown at 70. In some cases, the die may be secured to the chip carriers 68 via solder, adhesive, thermo-compression bonding, or in any other suitable way, as desired.

Again, as indicated by the dashed box, steps 68 and 70 may be performed during a second pass through the first subsystem 30 of FIG. 1. As noted above, with some die, for example certain flip chip type die, the placement of wire bonds during the second pass may not be necessarily, and thus may be omitted, if desired.

Next, the boats with the die and chip carriers are queued again as shown at 72. Seal rings are then placed on the chip carriers as shown at 74. This step 74, as indicated by the box, may be performed during a third pass through the first subsystem 30. The chip carriers loaded with die and seal rings are, while respectively in their boats, queued again as shown at 76.

From this fourth queue shown at 76, the method continues with the step of going to a second subsystem, as indicated by the box around steps 78-86. In the second subsystem, the boats are placed in a vacuum furnace, as shown at 78. While in the vacuum furnace, a first bake out is performed, as shown at 80. Next, as shown at 82, lids are placed on the individual chip carriers. If desired, getters are activated as shown at 84, and then the devices undergo cap, seal and, if desired, a second bake out step, as shown at 86. In some embodiments, the getters may be activated prior to placing the lids on the individual chip carriers, if desired. That is, step 84 may occur prior to step 82 in FIG. 2. Also, it is contemplated that getters may not be provided at all, and in this case, the getter activation step 84 may be eliminated altogether. The result is a hermetically sealed chip carrier containing a die and an optional activated getter, the chip carrier being carried by a boat carrier.

In an illustrative embodiment, some lids may be provided without getters. The devices packaged using lids without getters can be used to observe a number of process and device characteristics. For example, a completed device lacking a getter may help provide an indication of the level of seal and vacuum achieved using the packaging process since, without the getter provided, any residual substances or leaks are not masked by the effects of the getter. In some cases, a getter-less packaged device can provide an indication of the effectiveness of the getters that are provided.

In an illustrative embodiment, the cap and seal process occurs as follows. Once a furnace is loaded, the interior of a vacuum chamber is sealed and pumped down to a desired vacuum. Next, the chamber is heated to a temperature (e.g. 280 degrees Celsius) while hydrogen levels in the furnace are monitored and the vacuum level is observed. This bake out step continues until a desired hydrogen/vacuum level is reached, or a time limit expires.

If a two-chamber furnace is used, the lids having getters may be situated in the second chamber, and the second chamber may be pumped down to a desired vacuum level. The getters may be heated to a getter activation temperature (e.g. 450 degrees Celsius) for a predetermined time period such as 15 minutes. Once bake out is complete in the first chamber, the vacuum levels in the first and second chambers may be equalized, and a divider may be opened. The boats may then be shuttled into the second chamber. The second chamber may then be heated to a temperature that is at or above the eutectic solder temperature of the solder ring, and a desired vacuum may be provided. The lids may then be brought into engagement with the chip carriers to create a seal therebetween. In some embodiments, this is accomplished with a lid handler, as described above. The chamber may then be allowed to cool, and the vacuum may be released. The temperatures, times, and vacuum levels may all vary depending on the characteristics of the getters and solder, for example, as well as the desired end product characteristics.

When a single vacuum chamber is used, the above described steps may all take place in the single vacuum chamber, and the boats need not be shuttled between first and second vacuum chambers. Like above, the single vacuum chamber may include a lid handler. The lids may be temporarily secured to the lid handler, which may be suspended above the boats. The lid handler may include a separately controlled heater that heats the lids separate from the boats. For example, the lid handler may include a resistive heating element that heats the lid handler and thus the lids. This may allow the lids, and any accompanying getter, to be heated to the getter activation temperature (e.g. 350-500 degrees C.) separately from the boats, which may remain below the eutectic solder temperature (e.g. 200-350 degrees C.) during the bake out process. Thus, getter activation may occur in the same chamber and sometimes at or near the same time as the bake out process, if desired.

Figure 3:
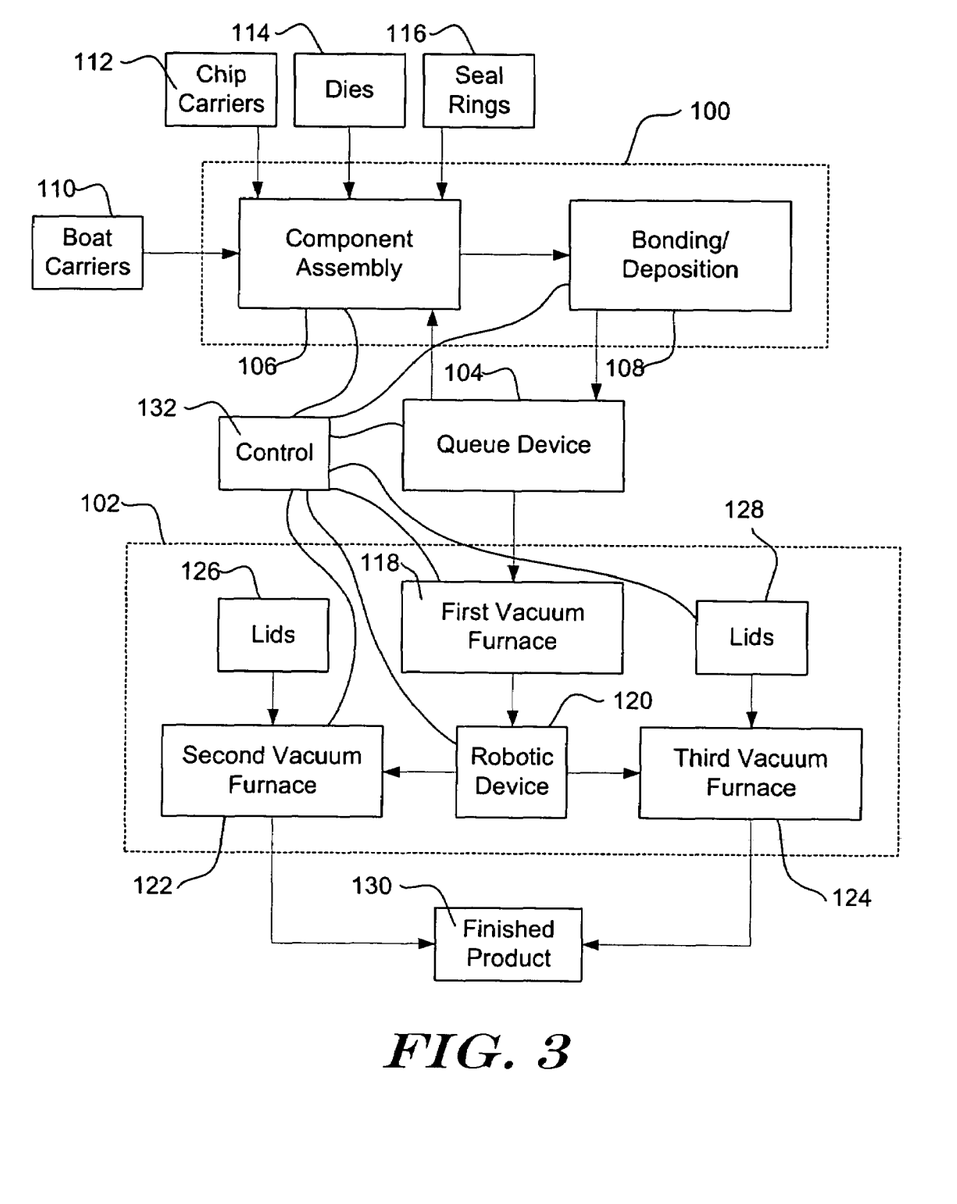
FIG. 3 is a block diagram of a system in accordance with another illustrative embodiment of the present invention.
Figure 4:
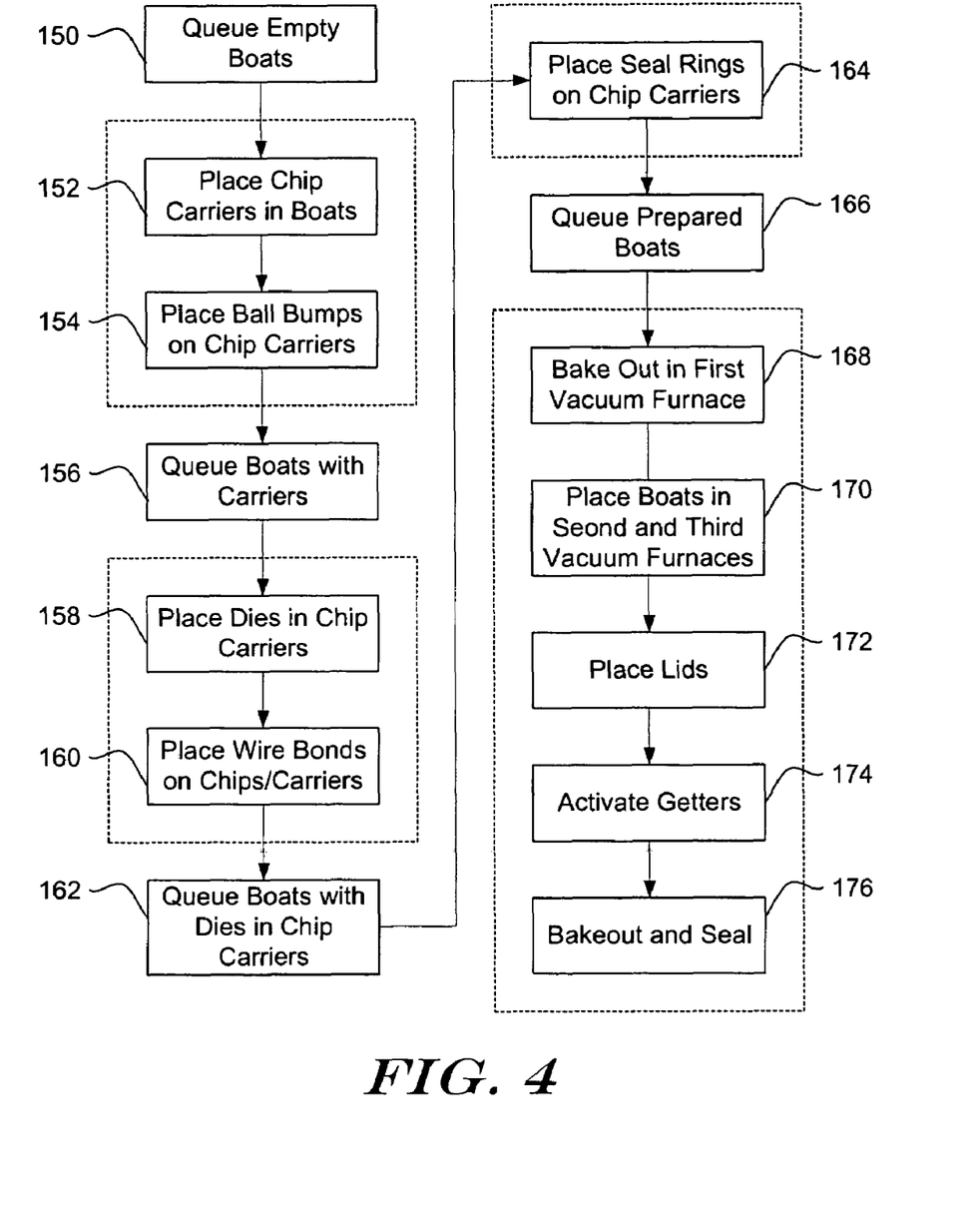
FIG. 4 is a block diagram of another illustrative method in accordance with the present invention.

FIG. 3 and FIG. 4 show another illustrative embodiment of the present invention. First, second and third vacuum devices are used in these embodiments. Referring to FIG. 4, a first subsystem 100 and a second subsystem 102 are shown, with a queue device 104 controlling component movement therebetween. The first subsystem works in similar fashion to that explained above with reference to FIG. 2.

More particularly, boat carriers 110 may pass through a component assembly device 106 a first time and may be populated with chip carriers. The boat carriers 110 may then go to the bonding/deposition device 108, where solder bumps may be placed thereon. From the bonding/deposition device 108, the boat carriers 110 may go to the queue device 104 a first time and get routed back to the component assembly device 106 a second time. Alternatively, two (or more) first subsystems 100a and 100b may be provided in series, with the boat carriers 110 passing from the bonding/deposition device 108a of the first subsystem 100a to the component assembly device 106b in the first subsystem 100b, if desired.

In the component assembly device 106 a second time, the chip carriers 110 may be populated with die 114 and passed to the bonding/deposition device 108. While in the bonding/deposition device 108 a second time, the die 114 may be secured to the chip carriers 112 and, if needed, wire bonds may be provided. From the bonding/deposition device 108 the second time, the boat carriers 110 may return to the component assembly device 106 for placement of sealing rings 116 on the chip carriers 112, if desired. From the component assembly device 106, and in the illustrative embodiment, the bonding/deposition device 108 simply passes the boat carriers 110 through to the queue device 104.

After the third pass to the queue device 104, the boat carriers 110 may be passed to the second subsystem 102. In the second subsystem 102, the boat carriers 110 first go to a first vacuum furnace 118. While in the first vacuum furnace 118, the chip carriers 112, die 114, and seal rings 116 are baked out by subjecting them to a vacuum of a first level at a first elevated temperature for a first time period. Like above, hydrogen levels may be monitored to determine if/when the devices are sufficiently baked out.

From the first vacuum furnace 118, the boat carriers 110 may pass to a robotic device 120 that loads each of second and third vacuum furnaces 122, 124 to capacity. Once so loaded, the vacuum furnaces 122 may be used to place and seal lids 126, 128 on the chip carriers 112, after any getters on the chip carriers 112, die 114, or lids 126, 128 are activated. The finished product 130 may include a batch of hermetically sealed, packaged die 114.

As with FIG. 1, FIG. 3 also illustrates a controller 132, which may optionally be included to control the functioning of the various system elements as described with reference to FIG. 3. For example, a controller 132 may be provided with a readable memory having an instruction set executable for performing the methods described with reference to FIG. 3 and/or the method described with respect to FIG. 4. The controller 132 may take any suitable form, including a microcontroller, computer, PDA, or the like. While the controller 132 is shown as having connections to several system elements, a wireless communication system/protocol may also be used for delivering commands from the controller to the system elements.

Turning now to FIG. 4, a method is illustrated for using three vacuum furnaces as described above with respect to FIG. 3. First, a number of empty chip boats may be queued, as shown at 150. Next, chip carriers may be placed in the boats, as shown at 152, and ball bumps may be placed on the chip carriers, as shown at 154. In some embodiments, the steps 152, 154 may take place in a first subsystem, as indicated by the dashed line box.

Next, the boats with carriers may be queued, as shown at 156. The boats with carriers can then be returned to the first subsystem (as indicated by the box), where die are placed and secured in the chip carriers as shown at 158, and wire bonds are optionally provided, as shown at 160. In some cases, the die may be secured to the chip carriers via solder, adhesive, thermo-compression bonding, or in any other suitable way, as desired. The boats with carriers and die may then be queued again, as shown at 162, and returned to the first subsystem (as indicated by the box) for placement of seal rings on the chip carriers, as shown at 164.

The prepared boats may again be queued, as shown at 166. The next steps may occur in a second subsystem, as indicated by the box enclosing steps 168-176. While in the second subsystem, a bake out of the chip boats, chip carriers, and die may be performed, as indicated at 168. The boats may then be placed in the second and/or third vacuum furnaces, depending on which of the second and/or third vacuum furnaces is available at the time, as indicated at 170. While in either the second or third vacuum furnace, lids are placed, as indicated at 172, on the chip carriers. Getters, if provided, may then be activated, as indicated at 174. Alternatively, the getters may be activated prior to loading the boats into the vacuum furnaces. A final bake out and seal may be performed, as indicated at 176, in the same vacuum furnace as was used for lid placement 172 and/or optional getter activation 174.

Those skilled in the art will recognize that the present invention may be manifested in a variety of forms other than the specific embodiments described and contemplated herein. Accordingly, departures in form and detail may be made without departing from the scope and spirit of the present invention as described in the appended claims.

What is claimed is:

1. A method for packing a die, comprising:
   automatically attaching a die to a chip carrier, resulting in a chip carrier assembly;
   automatically moving the chip carrier assembly into a vacuum chamber, wherein the vacuum chamber includes one or more lids therein;
   automatically securing a lid to the chip carrier assembly within the vacuum chamber, thereby forming a packaged die; and
   automatically removing the packaged die from the vacuum chamber.

2. The method of claim 1 wherein the chip carrier assembly is automatically moved into one of two or more vacuum chambers, depending on availability.

3. The method of claim 1 wherein the automatically attaching a die to a chip carrier step includes:
   automatically moving a chip carrier to a first station, wherein a die attach material is applied to at least part of the chip carrier; and
   automatically moving a chip carrier to a second station, wherein a die is brought into engagement with the die attach material.

4. The method of claim 3 wherein the automatically attaching a die to a chip carrier step further includes:
   automatically providing wire bonds between one or more pads on the die to one or more pads on the chip carrier.

5. The method of claim 3 wherein the first station includes a wire bonding machine.

6. The method of claim 3 wherein the second station includes an automatic component assembly machine.

7. The method of claim 1 further comprising the step of automatically providing a solder ring to the chip carrier before automatically moving the chip carrier assembly into the vacuum chamber.

8. The method of claim 7 wherein the solder ring is automatically provided by an automatic component assembly machine.

9. The method of claim 1 wherein the chip carrier assembly is automatically provided to a queuing device prior to automatically moving the chip carrier assembly into the vacuum chamber.

10. The method of claim 1 wherein the vacuum chamber includes a lid handler.

11. The method of claim 10 wherein the lid handler includes a heater for heating the lids.

12. The method of claim 11 wherein the lids include a getter, and the lid handler heater is used to activate the lid getter.

13. The method of claim 1 wherein the step of automatically moving the chip carrier assembly into the vacuum chamber is performed by a robot.

14. The method of claim 1 wherein the step of automatically securing the lid to the chip carrier assembly within the vacuum chamber includes the steps of applying heat and pressure.

15. The method of claim 14 wherein the step of automatically securing the lid to the chip carrier assembly within the vacuum chamber includes holding the lid with a lid handler.

16. The method of claim 15 further comprising the step of heating the lid handler to heat the lid prior to the step of automatically securing the lid to the chip carrier assembly within the vacuum chamber.

17. The method of claim 16 wherein the lid includes a getter, and the heating step heats the lid handler sufficiently to activate the getter.

18. The method of claim 1 wherein the step of automatically removing the packaged die from the vacuum chamber is performed by a robot.

19. The method of claim 1 further comprising the step of heating the chip carrier assembly in the vacuum chamber to a first temperature for a bake out time.

20. The method of claim 19, wherein the lids include a getter, the method further comprising the step of heating the lids in the vacuum chamber to a second temperature.

21. The method of claim 19 further comprising the step of:
   automatically moving the chip carrier assembly from the vacuum chamber to a second vacuum chamber after the chip carrier assembly is heated for the bake out time.

22. The method of claim 21 wherein the lids include a getter, the method further comprising the step of heating the lids in the second vacuum chamber to a second temperature before the chip carrier assembly is automatically moved into the second chamber.

* * * * *